United States Patent
Li et al.

(10) Patent No.: US 7,351,651 B2
(45) Date of Patent: Apr. 1, 2008

(54) STRUCTURE AND METHOD FOR CONTACT PADS HAVING A RECESSED BONDABLE METAL PLUG OVER OF COPPER-METALLIZED INTEGRATED CIRCUITS

(75) Inventors: Lei Li, Richardson, TX (US); Edgardo R. Hortaleza, Garland, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 11/240,885

(22) Filed: Sep. 30, 2005

(65) Prior Publication Data

US 2006/0082000 A1   Apr. 20, 2006

Related U.S. Application Data

(62) Division of application No. 10/804,363, filed on Mar. 18, 2004, now abandoned.

(51) Int. Cl.
*H01L 21/00* (2006.01)

(52) U.S. Cl. .................. 438/622; 438/687; 438/617
(58) Field of Classification Search ............ 257/762, 257/784, 734
See application file for complete search history.

(56) References Cited

U.S. PATENT DOCUMENTS

| | | | | |
|---|---|---|---|---|
| 4,910,155 A | * | 3/1990 | Cote et al. | 438/16 |
| 5,725,413 A | * | 3/1998 | Malshe et al. | 451/41 |
| 5,958,794 A | * | 9/1999 | Bruxvoort et al. | 438/692 |
| 6,046,966 A | * | 4/2000 | Drake et al. | 369/13.15 |
| 6,100,195 A | * | 8/2000 | Chan et al. | 438/687 |
| 6,157,078 A | * | 12/2000 | Lansford | 257/734 |
| 6,329,722 B1 | * | 12/2001 | Shih et al. | 257/786 |
| 6,376,353 B1 | * | 4/2002 | Zhou et al. | 438/612 |
| 6,468,906 B1 | * | 10/2002 | Chan et al. | 438/687 |
| 6,645,851 B1 | * | 11/2003 | Ho et al. | 438/626 |
| 6,649,523 B2 | * | 11/2003 | Basol et al. | 438/692 |
| 6,730,590 B2 | * | 5/2004 | Ohashi et al. | 438/618 |
| 6,780,772 B2 | * | 8/2004 | Uzoh et al. | 438/690 |
| 6,841,470 B2 | * | 1/2005 | Wang et al. | 438/633 |

(Continued)

OTHER PUBLICATIONS

Moussavi, M. "Comparison of barrier materials and deposition processes for copper integration." Interconnect Technology Conference, 1998. Proceedings of the IEEE 1998 International on Jun. 1-3, 1998 pp. 295-297.*

(Continued)

*Primary Examiner*—Laura M. Schillinger
(74) *Attorney, Agent, or Firm*—Yingsheng Tung; Wade James Brady, III; Frederick J. Telecky, Jr.

(57) ABSTRACT

A metal structure for an integrated circuit, which has copper interconnecting metallization (311) protected by an overcoat layer (320). A portion of the metallization is exposed in a window (301) opened through the thickness of the overcoat layer. The metal structure comprises a patterned conductive barrier layer (330) positioned on the copper metallization, wherein this barrier layer forms a trough with walls (331) conformal with the overcoat window. The height (331a) of the wall is less (between 3 and 20 %) than the overcoat thickness (320a), forming a step (340). A plug (350) of bondable metal, preferably aluminum, is positioned in the trough and has a thickness equal to the trough wall height (331a).

7 Claims, 3 Drawing Sheets

U.S. PATENT DOCUMENTS

| | | | |
|---|---|---|---|
| 7,061,114 B2* | 6/2006 | Hortaleza et al. | 257/762 |
| 2001/0023988 A1* | 9/2001 | Hatano et al. | 257/754 |
| 2005/0206007 A1* | 9/2005 | Li et al. | 257/762 |
| 2005/0215048 A1* | 9/2005 | Li et al. | 438/622 |
| 2005/0224984 A1* | 10/2005 | Hortaleza et al. | 257/762 |
| 2005/0224987 A1* | 10/2005 | Hortaleza et al. | 257/765 |
| 2006/0082000 A1* | 4/2006 | Li et al. | 257/784 |
| 2006/0094228 A1* | 5/2006 | Li et al. | 438/622 |

OTHER PUBLICATIONS

Wolf, S. & Tauber, R.N. (2000). Silicon Processing for the VLSI Era: vol. 1—Process Technology (2nd ed.). Sunset Beach: Lattice Press. p. 744.*

* cited by examiner

STRUCTURE AND METHOD FOR CONTACT PADS HAVING A RECESSED BONDABLE METAL PLUG OVER OF COPPER-METALLIZED INTEGRATED CIRCUITS

This is a divisional application of application Ser. No. 10/804,363 filed Mar. 18, 2004 now abandoned, the contents of which are herein incorporated by reference in its entirety.

FIELD OF THE INVENTION

The present invention is related in general to the field of electronic systems and semiconductor devices and more specifically to bond pad structures and fabrication methods of copper metallized integrated circuits.

DESCRIPTION OF THE RELATED ART

In integrated circuits (IC) technology, pure or doped aluminum has been the metallization of choice for interconnection and bond pads for more than four decades. Main advantages of aluminum include ease of deposition and patterning. Further, the technology of bonding wires made of gold, copper, or aluminum to the aluminum bond pads has been developed to a high level of automation, miniaturization, and reliability.

In the continuing trend to miniaturize the ICs, the RC time constant of the interconnection between active circuit elements increasingly dominates the achievable IC speed-power product. Consequently, the relatively high resistivity of the interconnecting aluminum now appears inferior to the lower resistivity of metals such as copper. Further, the pronounced sensitivity of aluminum to electromigration is becoming a serious obstacle. Consequently, there is now a strong drive in the semiconductor industry to employ copper as the preferred interconnecting metal, based on its higher electrical conductivity and lower electromigration sensitivity. From the standpoint of the mature aluminum interconnection technology, however, this shift to copper is a significant technological challenge.

Copper has to be shielded from diffusing into the silicon base material of the ICs in order to protect the circuits from the carrier lifetime killing characteristic of copper atoms positioned in the silicon lattice. For bond pads made of copper., the formation of thin copper(I)oxide films during the manufacturing process flow has to be prevented, since these films severely inhibit reliable attachment of bonding wires, especially for conventional gold-wire ball bonding. In contrast to aluminum oxide films overlying metallic aluminum, copper oxide films overlying metallic copper cannot easily be broken by a combination of thermocompression and ultrasonic energy applied in the bonding process. As further difficulty, bare copper bond pads are susceptible to corrosion.

In order to overcome these problems, the semiconductor industry adopted a structure to cap the clean copper bond pad with a layer of aluminum and thus reconstruct the traditional situation of an aluminum pad to be bonded by conventional gold-wire ball bonding. The described approach, however, has several shortcomings. First, the fabrication cost of the aluminum cap is higher than desired, since the process requires additional steps for depositing metal, patterning, etching, and cleaning. Second, the cap must be thick enough to allow reliable wire bonding and to prevent copper from diffusing through the cap metal and possibly poisoning the IC transistors.

Third, the aluminum used for the cap is soft and thus gets severely damaged by the markings of the multiprobe contacts in electrical testing. This damage, in turn, becomes so dominant in the ever decreasing size of the bond pads that the subsequent ball bond attachment is no longer reliable. Finally, the elevated height of the aluminum layer over the surrounding overcoat plane enhances the risk of metal scratches and smears. At the tight bond pad pitch of many high input/output circuits, any aluminum smear represents an unacceptable risk of shorts between neighbor pads.

SUMMARY OF THE INVENTION

A need has therefore arisen for a metallurgical bond pad structure suitable for ICs having copper interconnection metallization which combines a low-cost method of fabricating the bond pad structure, a perfect control of up-diffusion, a risk elimination of smearing or scratching, and a reliable method of bonding wires to these pads. The bond pad structure should be flexible enough to be applied for different IC product families and a wide spectrum of design and process variations. Preferably, these innovations should be accomplished while shortening production cycle time and increasing throughput, and without the need of expensive additional manufacturing equipment.

One embodiment of the invention is a metal structure for an integrated circuit, which has copper interconnecting metallization protected by an overcoat layer. A portion of the metallization is exposed in a window opened through the thickness of the overcoat layer. The metal structure comprises a patterned conductive barrier layer positioned on the copper metallization, wherein this barrier layer forms a trough with walls conformal with the overcoat window. The height of the wall is preferably less (between 3 and 20%) than the overcoat thickness. A plug of bondable metal, preferably aluminum, is positioned in the trough and has a thickness substantially equal to the trough wall height; the surface may be flat with the walls.

Another embodiment of the invention is a wafer-level method of fabricating a metal structure for a contact pad of an integrated circuit, which has copper interconnecting metallization protected by an overcoat layer. The method comprises the steps of opening a window in the overcoat layer to expose the copper metallization, whereby the window has walls reaching through the thickness of the overcoat layer. A barrier metal layer is then deposited over the wafer to cover the exposed copper metallization, the window walls, and the overcoat surface. Next, a bondable metal layer (preferably aluminum) is deposited over the barrier layer in a thickness sufficient to fill the overcoat window. Next, the wafer is chemically-mechanically polished so that the layers of bondable metal and barrier metal are removed over the overcoat, while these layers remain inside the window. The continued chemical-mechanical polishing step is controlled (polishing speed, time, and temperature) so that a predetermined amount of metal height (between 3 and 20%) is removed from the filled window, whereby a structural step is formed from the overcoat surface to the remaining metal.

Embodiments of the present invention are related to wire-bonded IC assemblies, semiconductor device packages, surface mount and chip-scale packages. It is a technical advantage that the invention offers a low-cost method of reducing the risk of aluminum-smearing or -scratching and electrical shorting between contact pads. The assembly yield of high input/output devices can thus be significantly improved. It is an additional technical advantage that the invention facilitates the shrinking of the pitch of chip contact pads without the risk of yield loss due to electrical shorting. Further technical advantages include the opportunity to scale the assembly to smaller dimensions, supporting the ongoing trend of IC miniaturization.

The technical advantages represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
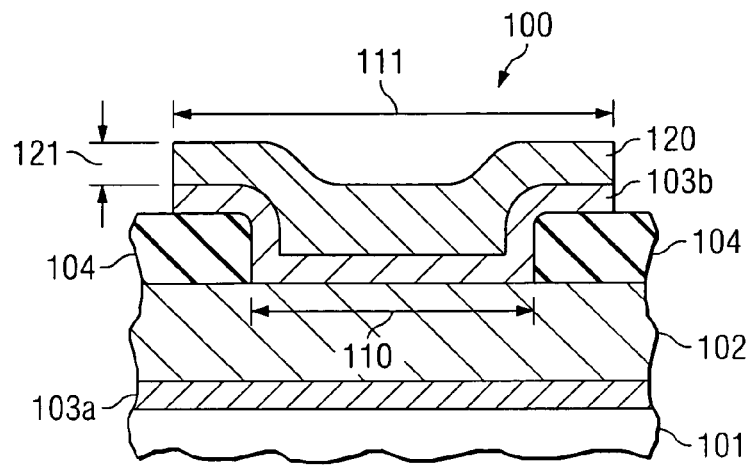
FIG. 1 depicts a schematic cross section of a contact pad of an integrated circuit (IC) with copper metallization according to known technology. The bondable metal is added as an additional layer elevated over the wafer surface.

The technical advantages offered by the invention can be best appreciated by comparing an embodiment of the invention with the conventional method of wire-bonding a contact pad of an integrated circuit (IC) chip, which uses copper as interconnecting metal. An example of a conventional structure is depicted in FIG. 1. In the schematic cross section of an IC contact pad generally designated 100, 101 is an intra-level dielectric, which may consist of silicon dioxide, a low-k dielectric, or any other suitable insulator customarily used in ICs. 102 represents the top level IC copper metallization (thickness typically between 200 and 500 nm, contained by barrier layers 103a and 103b (typically tantalum nitride, typically 10 to 30 nm thick) from diffusing into other IC materials. In the essentially moisture-impermeable overcoat layer 104 (typically between 500 to 1000 nm of silicon nitride, silicon oxynitride, or silicon dioxide, single-layered or multi-layered) is contact window 110, usually between 40 to 70 µm wide, which exposed the copper metallization 102 for establishing a contact. Barrier layer 103b overlaps overcoat 104 around the window perimeter to create a metallization width 111, which is thus larger than window 110 (typically about 45 to 75 µm diameter). The same width 111 holds for the bondable metal layer 120, which is aluminum or a copper-aluminum alloy. For reliable wire bonding, layer 120 has typically a thickness 121 between 700 and 1000 nm.

This considerable height 121 of the patterned aluminum layer 120 represents a substantial risk for accidental scratching or smearing of the aluminum. There are numerous wafer and chip handling steps in a typical assembly process flow after the aluminum patterning. The most important steps include back-grinding; transporting the wafer from the fab to the assembly facility; placing the wafer on a tape for sawing; sawing and rinsing the wafer; attaching each chip onto a leadframe; wire bonding; and encapsulating the bonded chip in molding compound. At each one of these process steps, and between the process steps, accidental scratching or smearing could happen.

Figure 2:
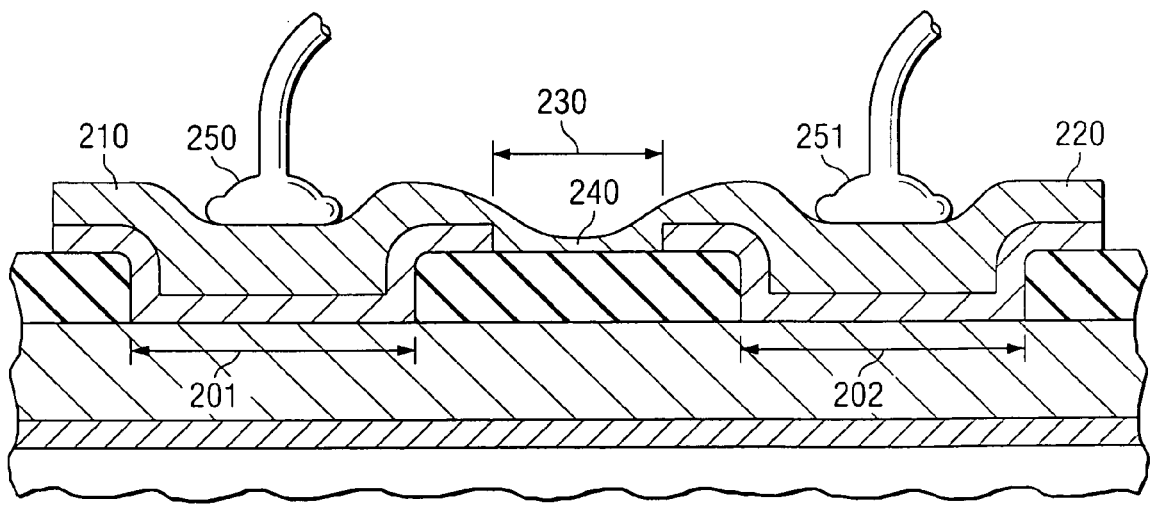
FIG. 2 illustrates a schematic cross section of two wire-bonded contact pads of a copper-metallized IC in known technology. The elevated bondable metal layers have been scratched and smeared, causing an electrical short.

An example is schematically indicated in FIG. 2, which is a cross section through two bonding pads 201 and 202 in close proximity (distance 230). The aluminum layer 210 of pad 201 and the aluminum layer 220 of pad 202 have been scratched so that the aluminum is smeared together at 240. As a consequence, the pads of bonds 250 and 251 form an electrical short.

Figure 3:
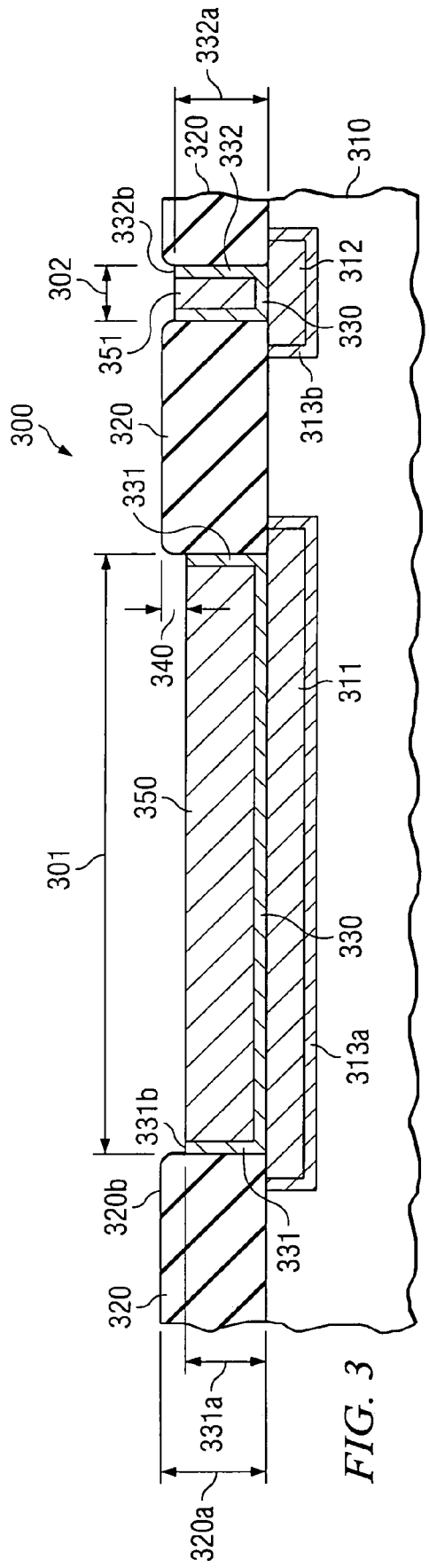
FIG. 3 is a schematic cross section of an embodiment of the invention depicting a contact pad of an IC with copper metallization, wherein the contact pad has a bondable metal plug.

An embodiment of the invention is shown in FIG. 3, illustrating a schematic cross section of a portion 300 of a semiconductor wafer. The interlevel insulating material 310, made, for instance, of low-k dielectric material, silicon dioxide, or a stack of dielectric materials, is covered by a protective overcoat 320. Preferred overcoat materials are practically moisture impermeable or moisture retaining, and mechanically hard; examples include one or more layers of silicon nitride, silicon oxynitride, silicon carbide, or a stack of insulating materials including polyimide. The overcoat has a thickness 320a in the range from 0.5 to 1.5 µm, preferably 1.0 µm. Windows 301 and 302 in the overcoat are opened to reach the top layer of the interconnecting metallization. The top metal layer consists of copper or a copper alloy and has a thickness preferably in the range from 0.2 to 0.5 µm. Layer portion 311 in window 301 serves the bond pad, layer portion 312 in window 302 is the metal in the scribe street. The copper metallization is contained by barrier layer 313a, and 313b respectively, from diffusing into insulator 310 or other integrated circuit materials; barrier layers 313a and 313b are preferably made of tantalum nitride and about 10 to 30 nm thick.

In order to establish low-resistance ohmic contact to the copper, one or more conductive barrier layers 330 are deposited over the copper, as indicated in FIG. 3. For a single layer, tantalum nitride is preferably selected. For a couple of layers, the first barrier layer is preferably selected from titanium, tantalum, tungsten, and alloys thereof; the layer is deposited over the exposed copper 311 with the intent to establish good ohmic contact to the copper by "gettering" the oxide away from the copper. A second barrier layer, commonly nickel vanadium, is deposited to prevent outdiffusion of copper. The barrier layer has a thickness preferably in the range from 0.02 to 0.03 µm. In the windows, the layers form a trough with walls conformal with the respective overcoat window. In FIG. 3, the trough walls for the bond pad window are designated 331, and the walls for the scribe street window 332.

As FIG. 3 indicates, the wall height 331a and 332a, respectively, is less than the overcoat thickness 320a. In the preferred embodiment, the wall height 331a (and 332a) is between about 6 and 30% less than the overcoat thickness 320a. Consequently, a step height 340 of about 0.1 to 0.2 µm between the overcoat surface 320b and the barrier wall surface 331b (and 332b) is created.

The volume enclosed by the barrier layer trough is filled with a plug of bondable metal, which has a thickness substantially equal to the trough height. The bondable metal is preferably aluminum or an aluminum alloy, such as aluminum-copper alloy. In FIG. 3, the trough formed by barrier layer 330 with wall 331 is filled by plug 350, and the trough formed by barrier layer 330 with wall 332 is filled by plug 351. Since the plug thickness is about equal to the trough wall height (331a and 332a, respectively), it exhibits the same recess step 340 relative to the overcoat surface 320b. Consequently, the plug 350, and 351 respectively, is protected against accidental scratches of the overcoat surface 320b, providing the undisturbed plug metal for reliable ball bonding.

Figure 4:
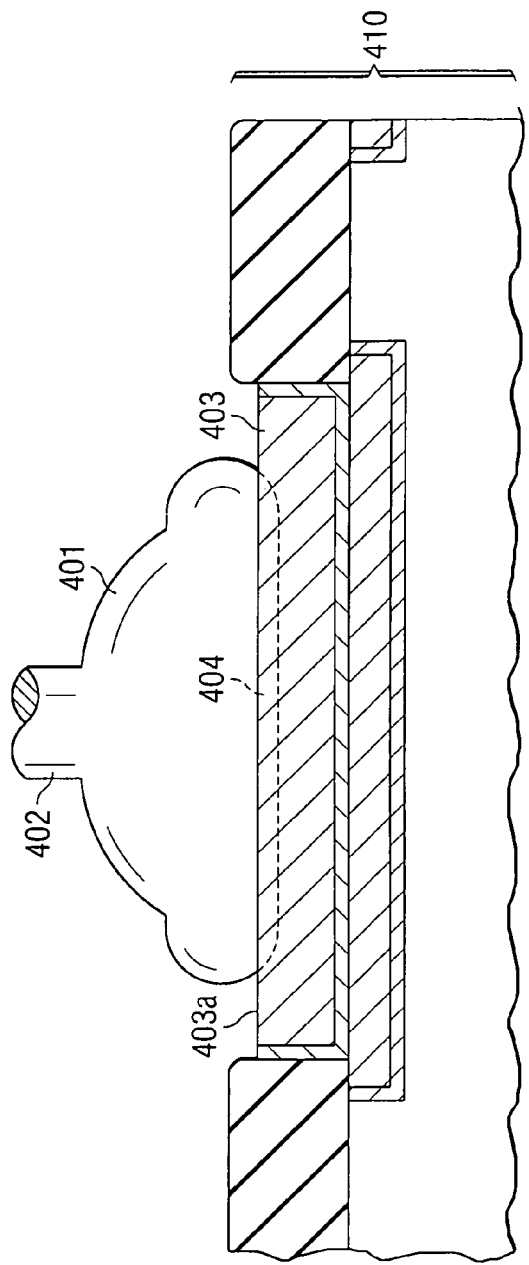
FIG. 4 is a schematic cross section of the bond pad metallization according to the invention, with a ball bond attached to the bondable metal plug.

The cross section of FIG. 4 illustrates schematically the contact pad of FIG. 3 after the chip has been singulated from the wafer in a sawing process (scribe street indicated by 410) and a ball bond has been attached. A free air ball 401 (preferably gold) of a metal wire 402 (preferably gold) is pressure-bonded to the undisturbed surface 403a of the plug 403 (preferably aluminum or an aluminum alloy). In the bonding process, intermetallic compounds 404 are formed in the contact region of ball and plug.

Another embodiment of the invention is a wafer-level method of fabricating a metal structure for a contact pad of an integrated circuit, which has copper interconnecting metallization. The wafer is protected by an overcoat layer, which includes silicon nitride as a practically moisture-impermeable material. The process flow is displayed in the schematic block diagram of FIG. 5. The method, starting at step 501, opens at a window in the overcoat layer at step 502 in order to expose the copper metallization. The window has walls reaching through the thickness of the overcoat layer.

In the next process step 503, a barrier metal layer is deposited over the wafer. Preferred barrier metal choices include tantalum or tantalum nitride, and nickel vanadium. Inside the window, this conductive barrier metal layer covers the exposed copper metallization and the window walls; outside the window, the barrier layer covers the overcoat surface. In step 504, a bondable metal layer is deposited over the barrier layer in a thickness sufficient to fill the overcoat window. Preferred bondable metal choices include aluminum and aluminum alloy.

Figure 5:
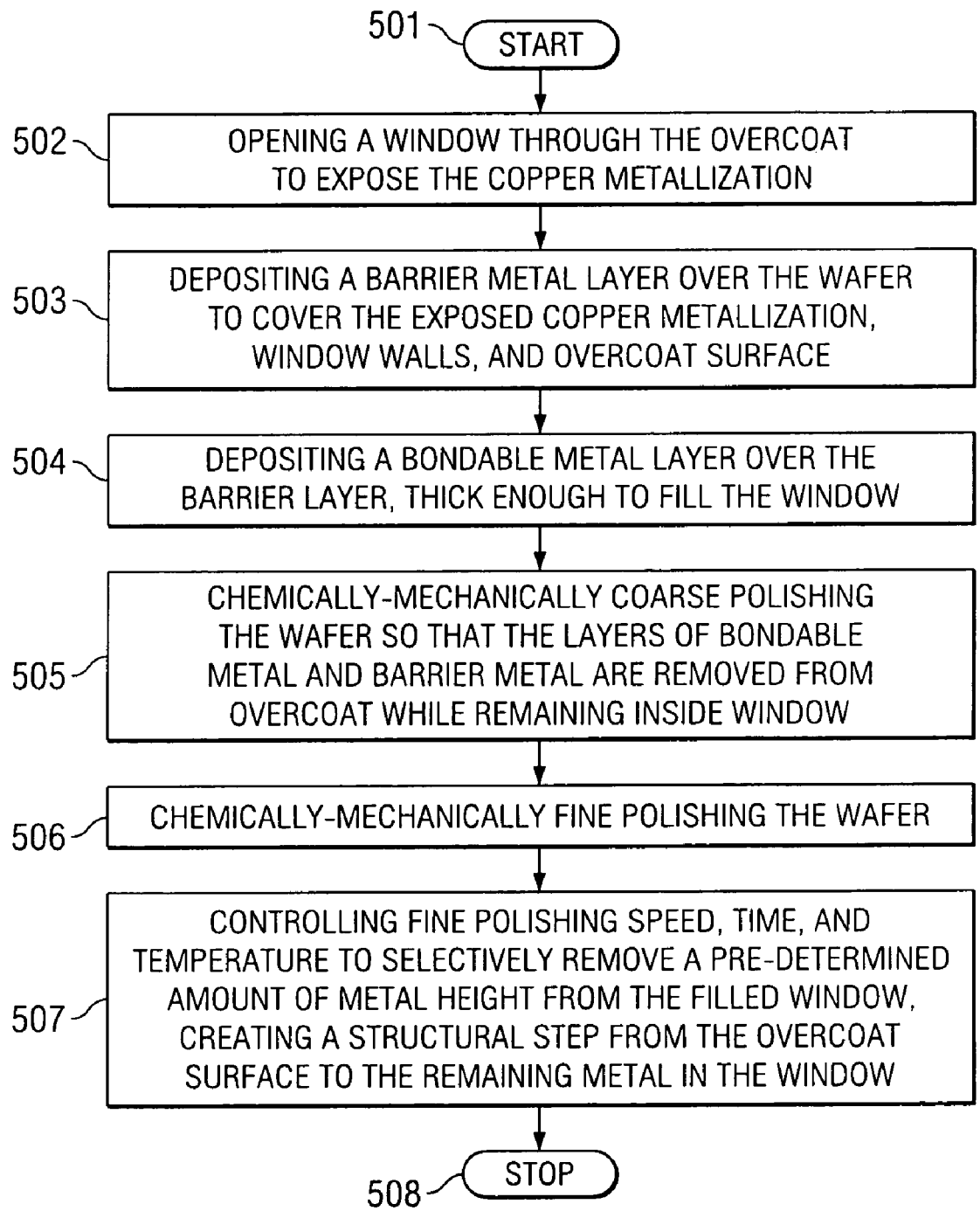
FIG. 5 is a block diagram of the device fabrication process flow according to another embodiment of the invention.

In the next process steps, the wafer is subjected to a chemical-mechanical polishing step. This process uses commercially available equipment, for instance the chemical-mechanical polishing (CPM) system by Applied Material Mirra Mesa, U.S.A., which is a MIPSS (missed-in-place slurry system) and has built-in control capabilities. While one polishing step may be sufficient, the block diagram of FIG. 5 illustrates two subsequent polishing steps. In step 505, a coarse polishing powder is used to polish the wafer so that the layer of bondable metal and the barrier metal layer are removed over the overcoat, while these layers remain inside the window. An example of a suitable coarse powder is the slurry SS-12 of the Cabot Corporation, U.S.A. The removal rate in step 505 is approximately 400 nm/min.

In step 506, a fine polishing powder is used to chemically-mechanically fine-polish the wafer under careful control of rotation speed, polishing time, and specimen temperature. The removal rate in step 506 is approximately 100 nm/min. A suitable polishing equipment is again the Applied Material Mirra Mesa CPM system. For the fine polishing step 506, this system is operated with Ceria HSS, a highly selective slurry made by Hitachi Corporation, Japan.

Alternatively, the coarse polishing step may be followed by a controlled chemical etching step.

Under continued control of speed, time and temperature, the chemical-mechanical fine polishing step 507 (or, alternatively, the chemical etching step) selectively affects the metal in the window (which is relatively soft compared to the hard overcoat) so that a pre-determined amount of metal height is selectively removed from the filled window. Consequently, a structural step is formed from the overcoat surface to the remaining metal in the window. This step comprises between 3 and 20% of the overcoat thickness. For an overcoat with 800 nm thickness, the step is preferably about 80 nm; for an overcoat with 1000 nm thickness, the step is preferably about 150 nm. The method concludes at step 508.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, the fabrication method can be modified so that the chemical-mechanical polishing is performed using a single slurry, but under modified conditions of polishing rotation and time, still producing the desired height step between the overcoat and the metal plug. As another example, the bondable metal plug has a surface on a flat level with the trough walls of the barrier layer.

It is therefore intended that the appended claims encompass any such modifications and embodiments.

We claim:

1. A wafer-level method of fabricating a metal structure for a contact pad of an integrated circuit having copper interconnecting metallization protected by an overcoat layer including silicon nitride, comprising the steps of:
    opening a window in said overcoat layer to expose said copper metallization, said window having walls reaching through the thickness of said overcoat layer;
    depositing a barrier metal layer over said wafer to cover said exposed copper metallization, window walls, and overcoat surface;
    depositing a bondable metal layer over said barrier layer in a thickness sufficient to fill said overcoat window;
    chemically-mechanically polishing said wafer so that said layers of bondable metal and barrier metal are removed over said overcoat outside said window; and
    chemically-mechanically polishing said wafer to remove the bondable metal and barrier metal to form a structural step of pre-determined height between the overcoat surface and the polished surface of the bondable metal.

2. The method according to claim 1 wherein said step of chemically-mechanically polishing comprises a step of coarse polishing followed by a step of fine polishing.

3. The method according to claim 2 wherein said step of chemically-mechanically coarse polishing comprises a removal rate of approximately 400 nm/mim.

4. The method according to claim 2 wherein said step of chemically-mechanically fine polishing is selective and comprises a removal rate of approximately 100 nm/mim.

5. The method according to claim 1 wherein said step of chemically-mechanically polishing comprises a step of coarse polishing followed by a step of etching.

6. The method according to claim 1 wherein said controls include polishing speed, time, and temperature.

7. The method according to claim 1 wherein said structural step comprises between 3% and 20% of said overcoat thickness.

* * * * *